United States Patent [19]

Terakado

[11] Patent Number: 5,309,467
[45] Date of Patent: May 3, 1994

[54] SEMICONDUCTOR LASER WITH INGAAS OR INGAASP ACTIVE LAYER

[75] Inventor: Tomoji Terakado, Tokyo, Japan

[73] Assignee: NEC Corporation, Tokyo, Japan

[21] Appl. No.: 957,798

[22] Filed: Oct. 8, 1992

[30] Foreign Application Priority Data

Oct. 8, 1991 [JP] Japan .................................. 3-259506

[51] Int. Cl.$^5$ .............................................. H01S 3/19
[52] U.S. Cl. .......................................... 372/45; 372/43
[58] Field of Search .................................. 372/43–48, 372/50

[56] References Cited

U.S. PATENT DOCUMENTS

| | | | |
|---|---|---|---|
| 4,546,479 | 10/1985 | Ishikawa et al. | 372/45 |
| 4,817,105 | 3/1989 | Yano | 372/50 |
| 5,073,805 | 12/1991 | Nomura et al. | 372/43 X |

FOREIGN PATENT DOCUMENTS

| | | |
|---|---|---|
| 58-219789 | 12/1983 | Japan . |
| 59-119719 | 7/1984 | Japan . |
| 61-228693 | 10/1986 | Japan . |
| 63-169086 | 7/1988 | Japan . |

OTHER PUBLICATIONS

Patent Abstracts of Japan, vol. 8, No. 239, Nov. 1, 1984, p. 81E276.
"Optical Communication Device Technology–Light--Emitting and Receiving Devices" by Hiroo Yonezu, pp. 225–243 (with English relevance) Feb. 1984.

Primary Examiner—John D. Lee
Attorney, Agent, or Firm—Sughrue, Mion, Zinn, Macpeak & Seas

[57] ABSTRACT

A semiconductor laser having a buried stripe structure is provided, which comprises a first cladding layer of InP, an active layer containing at least an InGaAsP or InGaAs layer, a barrier layer of $In_{1-x}Al_xAs$ (x=0.48 to 1.00), a second cladding layer of InP, a mesa-shaped stripe portion composed of the first cladding layer, active layer, barrier layer and second cladding layer, and a pair of buried layers disposed on both sides of the stripe portion so as to bury the same therebetween formed in this order on an InP substrate. The hetero barrier of conduction band between the active and barrier layers is increased by the barrier layer when an electric current is injected, thus being capable of restricting the electrons injected into the active layer to be leaked to the second cladding layer. It is preferable that a second barrier layer of $In_{1-x}Al_xAs$ (x=0.48 to 1.00) is disposed on each side of the stripe portion.

12 Claims, 3 Drawing Sheets

SEMICONDUCTOR LASER WITH INGAAS OR INGAASP ACTIVE LAYER

BACKGROUND OF THE INVENTION

1. Field of the Invention

This invention relates to a semiconductor laser as a main component of optical communication systems.

2. Description of the Prior Art

Recently, there is a rapidly growing tendency toward spreading the application field of optical communications from the key transmitting system to the optical communication systems including the subscriber system, local area network (LAN) system and data-link system accompanied with the progression of the optical communication technology. In order to respond to such highly advanced optical communication systems, the use of high performance optical devices unavoidably becomes a critical factor for success.

Such a semiconductor laser that has an $In_xGa_{1-x}As_yP_{1-y}$/InP double-hetero structure has been realized previously as a light source for the low-loss optical fiber communication purpose. However, with a p-type InP-/$In_xGa_{1-x}As_yP_{1-y}$/n-type InP double-hetero structure semiconductor laser with a wave length band of 1 $\mu$m, there arise problems that the luminous efficiency is low, the optical output is saturated with a low output and the operation at an elevated temperature is difficult because the characteristic temperature TO of oscillating threshold current is low compared with a GaAlAs/GaAs system semiconductor laser with a wavelength band of 0.8 $\mu$m as pointed out by Yonezu (refer to "Optical Communication Device Technology—Light Emitting and Receiving Devices"., pp. 225-243, 1984, published by Kogaku-Tosho Corp.).

One reason therefor is that the electrons injected into an active layer (light emitting layer) are re-combined with the holes without contributing to the light emission due to the leakage process of a carrier in a cladding layer, the Auger process and the like. With the $In_xGa_{1-x}As_yP_{1-y}$/InP system semiconductor laser, the value of $\Delta Ec/\Delta Ev$, which is a ratio of the amount of band discontinuity $\Delta Ec$ of conduction band and the amount of discontinuity $\Delta Ev$ of valence band, namely, so-called band offset ratio, is so small as 0.22/0.38 that the electrons injected into the active layer of InGaAs or InGaAsP easily pass through the hetero barrier and leak in the p-type InP cladding layer.

Particularly, in a semiconductor laser having an InGaAsP active layer, the electrons having a high kinetic energy are easily generated in the active layer through the Auger recombination process, so that the leakage of the electrons to the p-type InP cladding layer is accelerated. In addition, when operated at an elevated temperature, the electrons with a high energy will be generated into the InGaAsP active layer, so that the leakage of the electrons to the p-type InP cladding layer will be further accelerated.

Thus, an object of this invention is to provide a semiconductor laser having an InGaAsP layer or InGaAs layer as an active layer which has a high luminous efficiency and output performance as well as the capability of being operated at an elevated temperature.

SUMMARY OF THE INVENTION

A semiconductor laser in a first aspect of this invention comprises an InP semiconductor substrate, a first cladding layer of InP formed on the substrate, an active layer formed on the first cladding layer and having at least one of InGaAsP layer and InGaAs layer, an $In_{1-x}Al_xAs$ barrier layer (x=0.48 to 1.00) formed on the active layer and a second cladding layer of InP formed on the barrier layer.

With a material as the $In_{1-x}Al_xAs$/InGaAsP system or $In_{1-x}Al_xAs$/InGaAs system. If x=0.48 which is a value that is lattice-matched with the InP, the band offset ratio ($\Delta Ec/\Delta Ev$) is so large as 0.50/0.22 that the band discontinuity of conduction band becomes large. If the x is varied from 0.48 to 1.00 to change the composition of In and Al, the crystal is deformed, resulting in an increase in band offset ratio. As a result, the band discontinuity of conduction band is advantageously further enlarged.

In the semiconductor laser of this aspect, the barrier layer of $In_{1-x}Al_xAs$ (x=0.48 to 1.00) is provided between the active layer including an InGaAs layer or InGaAsP layer and the second cladding layer, so that the hetero barrier (band offset) of conduction band between the active layer and barrier layer is increased when an electric current is injected thereinto. As a result, the leakage of the electrons injected into the active layer to the second cladding layer can be restricted. This action is particularly outstanding for the electrons with a high kinetic energy generated by the Auger process.

Accordingly, the electrons injected into the active layer are re-combined with the holes at a high probability, so that high luminous efficiency and high output performance and operation at an elevated temperature becomes possible.

It is preferable that the semiconductor laser of this aspect further comprises a mesa-shaped stripe portion including the first cladding layer, active layer, barrier layer and second cladding layer, and a pair of buried layers of InP disposed on the both sides of the mesa-shaped stripe portion so as to bury the portion therebetween.

A semiconductor laser of a second aspect of this invention comprises an InP semiconductor substrate, a first cladding layer of InP formed on the substrate, an active layer formed on the first cladding layer and having at least one of an InGaAsP layer or InGaAs layer, a first barrier layer of $In_{1-x}Al_xAs$ (x=0.48 to 1.00) formed on the active layer, a second cladding layer of InP formed on the first barrier layer, a mesa-shaped stripe portion including the first cladding layer, active layer, first barrier layer and second cladding layer, a pair of second barrier layers of $In_{1-x}Al_xAs$ (x=0.48 to 1.00) disposed on the both sides of the mesa-shaped stripe portion so as to cover the side surfaces thereof, and a pair of buried layers of InP disposed on the pair of the second barrier layers at the both sides of the mesa-shaped stripe portion so as to bury the portion therebetween.

In the semiconductor laser of this aspect, the first barrier layer of $In_{1-x}Al_xAs$ (x=0.48 to 1.00) is provided between the active layer containing an InGaAs layer or InGaAsP layer and the second cladding layer of p-type InP, so that as in the first aspect, high luminous efficiency and high output performance and elevated temperature operation becomes possible.

In the semiconductor laser in this aspect, the second barrier layer of $In_{1-x}Al_xAs$ (x=0.48 to 1.00) is provided on the both sides of the mesa-shaped stripe portion so as to cover the side surfaces of the active layer, so that for the same reason as of the first barrier layer, the ineffective current generated by the leakage of the electrons injected into the active layer to the buried layers through the side surfaces of the active layer can be restricted. Accordingly, the effects on the luminous efficiency and an output and elevated temperature operating performances can be further improved than the case of the first aspect.

In one preferred embodiment, the second barrier layers are covered not only the both side surfaces of the mesa-shaped stripe portion but also cover the surface of the first cladding layer. In this case, the direct flow of the electrons from the first cladding layer to the buried layers not through the active layer can be restricted, so that the luminous efficiency and an output and elevated temperature performances can be advantageously further improved than the case of not covering the surface of the first cladding layer.

In another preferred embodiment, a second buried layer is provided between the pair of the second barrier layers and the pair of the buried layers, which is formed, for example, of InP.

DESCRIPTION OF THE PREFERRED EMBODIMENTS

Figure 1:
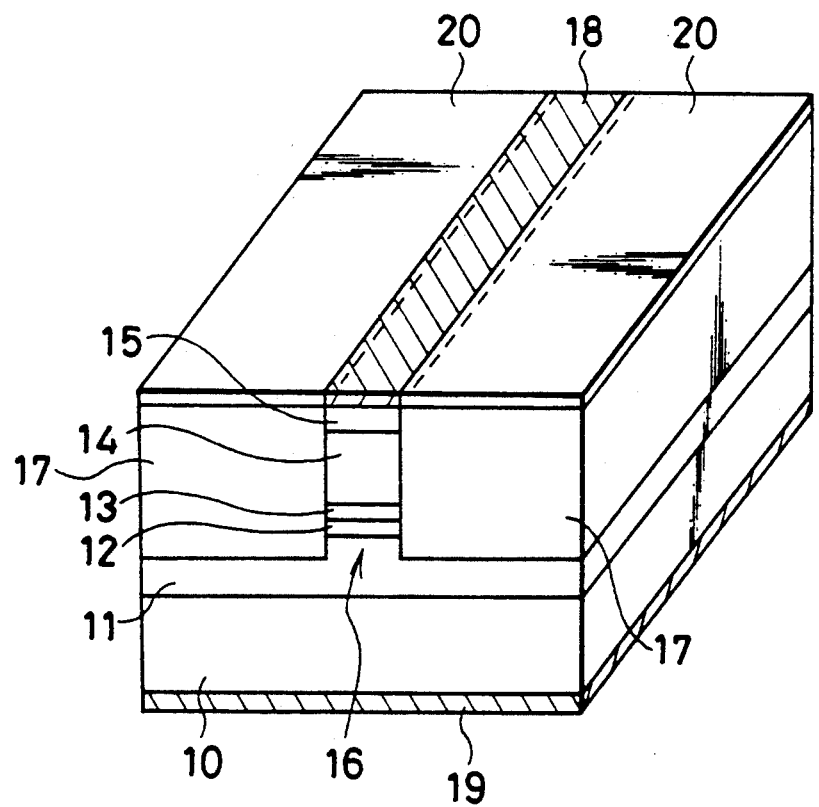
FIG. 1 is a perspective view of a semiconductor laser according to a first embodiment of this invention.

Preferred embodiments of this invention will be described below by referring to the drawings attached.

First Embodiment

FIG. 1 shows a semiconductor laser of a first embodiment of this invention.

On an n-type InP semiconductor substrate 10 with a thickness of about 100 $\mu$m, a first cladding layer 11 of n-type InP (thickness of 1 $\mu$m, carrier concentration of $2 \times 10^{17}$ cm$^{-3}$), an active layer 12 of InGaAsP being lattice-matched with the InP and having a band-gap wavelength of 1.3 $\mu$m (thickness of 0.1 $\mu$m, non-doped), a first barrier layer 13 of p-type In1-xAlxAs (x=0.54) (thickness of 0.02 $\mu$m, carrier concentration of $5 \times 10^{17}$ cm$^{-3}$), a second cladding layer 14 of p-type InP (thickness of 1.5 $\mu$m, carrier concentration of $5 \times 10^{17}$ cm$^{-3}$) and a contact layer 15 of p-type InGaAsP (thickness of 0.5 $\mu$m, carrier concentration of $1 \times 10^{19}$ cm$^{-3}$) are laminated in this order.

The upper part of the first cladding layer 11, the active layer 12, the first barrier layer 13, the second cladding layer 14 and the contact layer 15 have their both sides etched out to form a strip-shaped mesa portion 16 having a width of 1.5 $\mu$m and a height of 2.5 $\mu$m. On both sides of the mesa portion 16 thus obtained by etching, buried layers 17 of semi-insulating InP with an addition of Fe are formed in pair so as to bury the etched areas thereof on both sides of the mesa portion 16. The upper surfaces of the buried layers 17 are at the same level as the top surface of the mesa portion 16. That is, the upper surfaces of the buried layers 17 and the top surface of the mesa portion 16 form one plane.

On the contact layer 15 formed on the mesa portion 16, a p-side electrode 18 of an Au—Zn alloy is formed and on the surfaces of the paired buried layers 17, dielectric layers 20 of SiO$_2$ are respectively formed. On the back surface of the substrate 10 is formed an n-side electrode 19 of an Au—Ge—Ni alloy.

The semiconductor laser as structured above is produced as follows:

First, on the n-type InP semiconductor substrate 10 with a thickness of 350 nm, the first cladding layer 11 of n-type InP, the active layer 12 of InGaAsP, the first barrier layer 13 of p-type In$_{1-x}$Al$_x$As (x=0.54), the second cladding layer 14 of p-type InP and the contact layer 15 of p-type InGaAsP are laminatedly formed in this order by a vapor phase growth method or a molecular beam growth method.

Subsequently, a dielectric layer is formed of SiO$_2$ on the contact layer 15 by a chemical vapor deposition (CVD) method or the like and then, with the dielectric layer as a mask, the lamination body thus formed is etched with a mixing solution of bromine and methyl alcohol thereby forming the mesa portion 16 which is stripe-shaped and has a width of 1.5 $\mu$m and a height of 2.5 $\mu$m. Thereafter, with the same dielectric layer as a mask, the first buried layer 17 of semi-insulating InP with an addition of Fe is selectively grown on each side of the mesa portion 16 by the vapor phase growth method or molecular beam growth method, thereby burying the etched areas thereof.

Next, the p-type electrode 18 is formed of an Au—Zn alloy on the contact layer 15 on the mesa portion 16 and then, the dielectric layer 20 is formed of SiO$_2$ on the paired buried layers 17. Thereafter, the back surface of the substrate 10 is polished so as to be about 100 $\mu$m thick and then, the n-side electrode 19 is formed of an Au—Ge—Ni alloy thereon. Thus, the semiconductor laser as shown above is finished.

Figure 3:
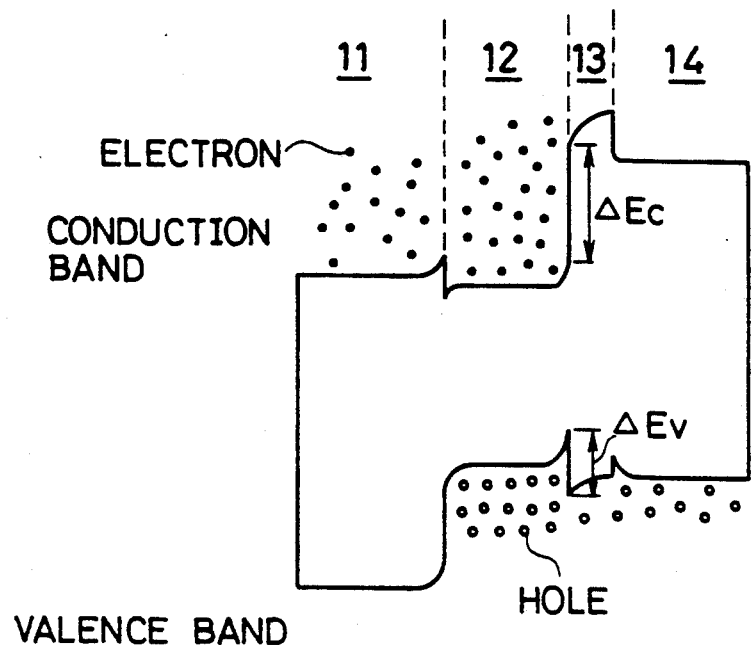
FIG. 3 shows a band structure in the vicinity of an active layer when a light is emitted of the semiconductor laser shown in FIG. 1.

In this semiconductor laser, the barrier layer 13 of p-type In$_{1-x}$Al$_x$As (x=0.54) is provided between the active layer 12 of InGaAsP and the second cladding layer 14 of p-type InP and as a result, the hetero barrier ($\Delta$Ec) of conduction band between the active layer 12 and barrier layer 13 becomes, as shown in FIG. 3, large when an electric current is injected thereinto. Accordingly, the electrons injected into the active layer are difficult to be leaked to the cladding layer 14 and the re-combination of the electrons and holes are carried out efficiently. Consequently, the luminous efficiency is improved and high output can be ensured as well as permitting operation at elevated temperatures. Also, in FIG. 3, $\Delta$Ev shows the hetero barrier of valence band between the active layer 12 and barrier layer 13.

For example, when the semiconductor laser of this embodiment was operated at a temperature of 85° C. and an output of 5 mW under conditions that the resonator length is 300 $\mu$m and the end surface reflectance ranges are from 30 to 80%, the operating current was about 40 mA.

The above explanations were made on the semiconductor laser having the stripe-shaped mesa portion 16, but not limited thereto and as a result, such one that does not have the mesa portion 16 may be applied therefor.

Second Embodiment

Figure 2:
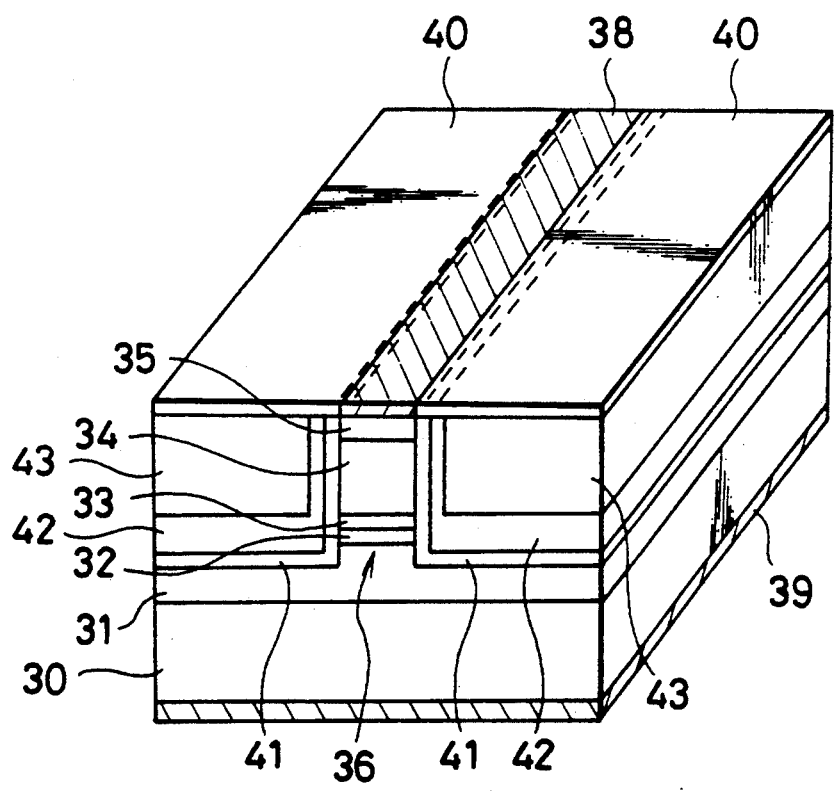
FIG. 2 is a perspective view of a semiconductor laser according to a second embodiment of this invention.

FIG. 2 shows a semiconductor laser according to a second embodiment of this invention.

On an n-type InP semiconductor substrate 30 with a thickness of about 100 μm, a first cladding layer 31 of n-type InP (thickness of 1 μm, carrier concentration of $2 \times 10^{17}$ cm$^{-3}$). an InGaAsP active layer 33 being lattice-matched with the InP and having a band-gap wavelength of 1.3 μm (thickness of 0.1 μm, non-doped), a first barrier layer 33 of p-type In$_{1-x}$Al$_x$As (x=0.54) (thickness of 0.02 μm, carrier concentration of $5 \times 10^{17}$ cm$^{-3}$), a second cladding layer 34 of p-type InP (thickness of 1.5 μm, carrier concentration of $5 \times 10^{17}$ cm$^{-3}$) and a p-type InGaAsP contact layer 35 (thickness of 0.5 μm, carrier concentration of $1 \times 10^{19}$ cm$^{-3}$) are laminated in this order.

The upper part of the first cladding layer 31, the active layer 32, the first barrier layer 33, the second cladding layer 34 and the contact layer 35 have their both sides etched out to form a stripe-shaped mesa portion 36 having a width of 1.5 μm and a height of 2.5 μm.

This structure is the same as that of the first embodiment as shown in FIG. 1.

Second barrier layers 41 of p-type In$_{1-x}$Al$_x$As (x=0.54) (thickness of 0.02 μm, carrier concentration of $5 \times 10^{17}$ cm$^{-3}$) are formed in pair so as to be respectively provided on the both side surfaces of the mesa portion 36 and on the upper surfaces of first cladding layers 31 that is etched out. As a result, the second barrier layers 41 each is cross-sectionally shaped in an L-letter form as shown in FIG. 2. That is, the upper surfaces of the first cladding layer 31 and the side surfaces of the mesa portion 36 are covered with the second barrier layer 41.

On the pair of the second barrier layers 41, a pair of first buried layers 42 are formed of p-type InP so as to provide a thickness of 0.5 μm and a carrier concentration of $5 \times 10^{17}$ cm$^{-3}$. The respective first buried layer 42 covers the entire surface of the respective second barrier layer 41. As a result, the first barrier layers 42 also are cross-sectionally shaped in an L-letter form as shown in FIG. 2.

On the pair of the first buried layers 42, a pair of second buried layers 43 are formed of n-type InP so as to provide a thickness of 2.0 μm and a carrier concentration of $5 \times 10^{17}$ cm$^{-3}$. The respective second barrier layer 43 covers the entire surface of the respective first buried layer 42. The upper surface ofs the second buried layers 43 are at the same level as the top surface of the mesa portion 36, namely, the upper surfaces of the second buried layers 43 and the top sueface of the mesa portion 36 make one plane.

On the contact layer 35 on the mesa portion 36, a p-side electrode 38 is formed of an Au—Zn alloy and on the second buried layers pair 43, dielectric layers 40 are respectively formed of SiO$_3$. On the back surface of the substrate 30, an n-side electrode 39 is formed of an Au—Ge—Ni alloy.

Next, the production method of the semiconductor laser as shown above will be described below.

First, on the n-type InP semiconductor substrate 30 with a thickness of 350 μm, the first cladding layer 31, active layer 32, first barrier layer 33, second cladding layer 34 and contact layer are grown in this order and then, the mesa portion 36 is formed by the same methods respectively as in the first embodiment.

Subsequently, with the dielectric layer of SiO$_z$ used for forming the mesa portion 36 as a mask, the second barrier layers 41 are formed of p-type In$_{1-x}$Al$_x$As (x=0.54) selectively on the both side surfaces of the mesa portion 36 by the vapor-phase growth method or molecular beam growth method, thereby obtaining the second barrier layers 41 cross-sectionally shaped in an L-letter form as shown in FIG. 2.

Next, on the second barrier layers 41 at the both sides of the mesa portion 36, the first buried layers 42 of p-type InP are selectively grown. Thus, the first buried layers 42 cross-sectionally shaped in an L-letter form are obtained as shown in FIG. 2.

Further, on the first buried layers 42 at the both sides of the mesa portion 36, the second buried layers 43 of n-type InP are selectively grown. Thus, the etched portion provided on each side of the mesa portion 36 is buried.

Next, the p-type electrode 38 is formed of an Au—Zn alloy on the contact layer 35 on the mesa portion 36, then, the back surface of the n-type InP substrate 30 is polished so as to be about 100 μm thick, and the n-side electrode 39 is formed of an Au—Ge—Ni alloy on the back surface thereof. Thus, the semiconductor laser of the second embodiment is finished.

In the semiconductor laser as shown above, the p-type In$_{1-x}$Al$_x$As barrier layer 33 (x=0.54) is provided between the InGaAsP active layer 32 and the second cladding layer 34 of p-type InP and as a result, similar to the first embodiment, the electrons injected into the active layer can be restricted to be leaked to the second cladding layer.

Figure 4:
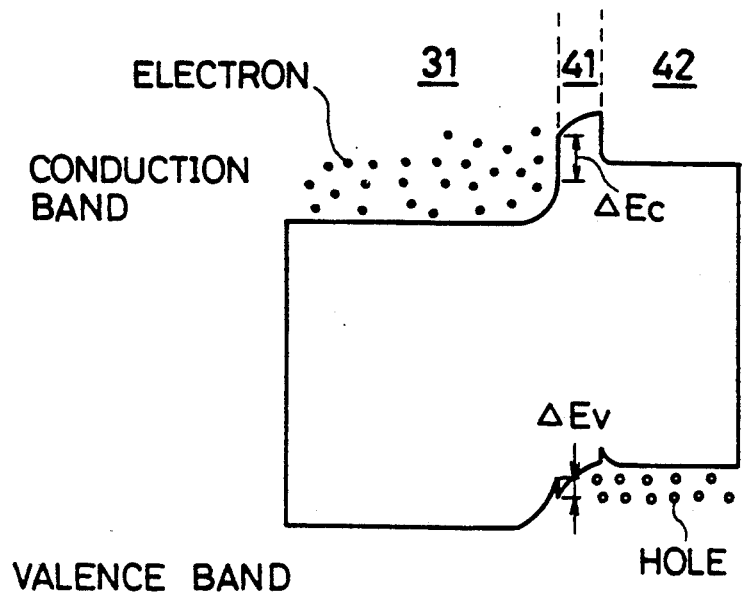
FIG. 4 shows a band structure between a first buried layer and a first cladding layer when a light is emitted of the semiconductor laser shown in FIG. 2.

In addition, as the stripe-shaped active layer 32 is provided sandwiched between the second barrier layers 41 of p-type In$_{1-x}$Al$_x$As (x=0.54), the hetero barrier (ΔEc) of conduction band between the first buried layer 42 and the first cladding layer 31 when a light is emitted becomes large as shown in FIG. 4. As a result, the number of electrons to be leaked through the side surfaces of the active layer 32 to the second buried layers 42 of p-type InP can be restricted. In addition, in FIG. 4, ΔEv shows the hetero barrier of valence band between the first cladding layer 31 and first buried layer 42.

Further in addition, the number of electrons to be leaked from the first cladding layer 31 not through the active layer 42 but directly into the second buried layers 42, which is an ineffective current, can be also restricted. As a result, the electrons injected into the active layer 42 are largely re-combined with the holes, so that the luminous efficiency and output higher than those in the first embodiment can be provided and yet the operation at an elevated temperature than those in the first embodiment becomes possible.

For example, when the semiconductor laser of this embodiment was operated at a temperature of 85° C. and an output of about 5 mW under conditions that the end surface reflectance ranges from 30 to 80% and the resonator length is 300 μm, the operating current was about 35 mA, which is smaller than that obtained in the first embodiment.

In the first and second embodiments, the dimensions are specified as shown above, however, it is needless to say that such dimensions should be appropriately adopted because the crystal growth, crystal mixture and etching condition are varied depending largely on a growth method to be used and its conditions.

As the materials to be used for the electrodes 18, 19, 38 and 39 and the dielectric layers 20 and 40, there is no limitation particularly.

Referring to the barrier layers 13, 33 and 41, the x of $In_{1-x}Al_xAs$ can be arbitrarily selected in the range of 0.48 to 1.00 so far as it is in the range of the critical layer thickness possible to provide a good crystal growth.

In addition, referring to the active layers 12 and 32, any layer other than those shown in these embodiment may be applied if it includes an InGaAsP layer or InGaAs layer and it may be structured in multi-quantum wells formation.

What is claimed is:

1. A semiconductor laser comprising:
    a semiconductor substrate of InP:
    a first cladding layer of InP formed on said substrate:
    an active layer formed on said first cladding layer, said first cladding layer including at least one of an InGaAsP layer and an InGaAs layer:
    a barrier layer of $In_{1-x}Al_xAs$ ($0.48 < x \leq 1.00$) formed on said active layer; and
    a second cladding layer of InP formed on said barrier layer.

2. A semiconductor laser comprising:
    a semiconductor substrate of InP;
    a first cladding layer of InP formed on said substrate;
    an active layer formed on said first cladding layer, said first cladding layer including at least one of an InGaAsP layer and an InGaAs layer;
    a barrier layer of $In_{1-x}Al_xAs$ ($0.48 < x \leq 1.00$) formed on said active layer;
    a second cladding layer of InP formed on said barrier layer;
    a mesa-shaped stripe portion including said first cladding layer, active layer, barrier layer and second cladding layer; and
    a pair of buried layers of InP disposed on each side of said mesa-shaped stripe portion so as to bury said portion therebetween.

3. A semiconductor laser comprising:
    a semiconductor substrate of InP;
    a first cladding layer of InP formed on said substrate;
    an active layer formed on said first cladding layer, said active layer including at least one of an InGaAsP layer and an InGaAs layer;
    a first barrier layer of $In_{1-x}Al_xAl_xAs$ ($0.48 < x \leq 1.00$) formed on said active layer;
    a second cladding layer of InP formed on said first barrier layer;
    a mesa-shaped stripe portion including said first cladding layer, active layer, first barrier layer and second cladding layer;
    a pair of second barrier layers of $In_{1-x}Al_xAs$ ($0.48 < x \leq 1.00$) disposed on each side of said mesa-shaped stripe portion so as to cover side surfaces of said portion; and
    a pair of buried layers of InP disposed on said pair of said second barrier layers at each side of said mesa-shaped stripe portion so as to bury the portion therebetween.

4. The semiconductor laser as claimed in claim 3, wherein said pair of barrier layers cover not only both side surfaces of said mesa-shaped stripe portion but also cover a surface of said first cladding layer.

5. The semiconductor laser as claimed in claim 4, wherein a pair of second buried layers of InP are disposed between said pair of said second barrier layers and said pair of said buried layers respectively.

6. The semiconductor laser as claimed in claim 3, wherein a pair of second buried layers of InP are disposed between said pair of said second barrier layers and said pair of said buried layers respectively.

7. The semiconductor laser as claimed in claim 3, wherein said active layer is lattice-matched with InP, and said x is in the range of $0.48 < x \leq 1.00$ so that said barrier layer is lattice-mismatched with InP.

8. The semiconductor laser as claimed in claim 3, further comprising:
    a first electrode formed on the top of said mesa-shaped portion; and
    a second electrode formed on an opposite side of said substrate to said first cladding layer.

9. A semiconductor laser comprising:
    a semiconductor substrate of InP;
    a first cladding layer of InP formed on said substrate;
    an active layer formed on said first cladding layer, said first cladding layer including at least one of an InGaAsP layer and an InGaAs layer;
    a barrier layer of $In_{1-x}Al_xAs$ ($0.48 \leq X \leq 1.00$) formed on said active layer;
    a second cladding layer of InP formed on said barrier layer, said barrier layer being lattice-mismatched with InP;
    a mesa-shaped stripe portion including said first cladding layer, active layer, barrier layer and second cladding layer; and
    a pair of buried layers of InP disposed respectively on both sides of said mesa-shaped stripe portion so as to bury said portion therebetween.

10. The semiconductor laser as claimed in claim 9, wherein said active layer is lattice-matched with InP, and said x is in the range of $0.48 < X \leq 1.00$ so that said barrier layer is lattice-mismatched with InP.

11. The semiconductor laser as claimed in claim 10, further comprising:
    a first electrode formed on the top of said mesa-shaped portion; and
    a second electrode formed on an opposite side of said subsrate to said first cladding layer.

12. The semiconductor laser as claimed in claim 9, further comprising:
    a first electrode formed on the top of said mesa-shaped portion; and
    a second electrode formed on an opposite side of said subsrate to said first cladding layer.

* * * * *

UNITED STATES PATENT AND TRADEMARK OFFICE
CERTIFICATE OF CORRECTION

PATENT NO. : 5,309,467
DATED : May 3, 1994
INVENTOR(S) : TERAKADO

It is certified that error appears in the above-identified patent and that said Letters Patent is hereby corrected as shown below:

Column 2, line 6, change "AI" to --Al--.

Column 5, line 58, change "$O_3$" to --$O_2$--.

Signed and Sealed this

Eleventh Day of October, 1994

Attest:

BRUCE LEHMAN

Attesting Officer     Commissioner of Patents and Trademarks